United States Patent [19]
Mineyoshi

[11] Patent Number: 5,694,095
[45] Date of Patent: Dec. 2, 1997

[54] SURFACE ACOUSTIC WAVE RESONANCE DEVICE ADAPTED TO SIMPLE AND PRECISE ADJUSTMENT OF RESONANT FREQUENCY

[75] Inventor: Seiji Mineyoshi, Kawasaki, Japan

[73] Assignee: Fujitsu Limited, Kawasaki, Japan

[21] Appl. No.: 763,627

[22] Filed: Dec. 4, 1996

Related U.S. Application Data

[63] Continuation of Ser. No. 406,520, Mar. 20, 1995, abandoned.

[30] Foreign Application Priority Data

Apr. 26, 1994 [JP] Japan ................... 6-088611

[51] Int. Cl.$^6$ ................ H03H 9/00; H03H 9/64
[52] U.S. Cl. ................. 333/193; 333/195; 310/313 R
[58] Field of Search ............... 333/193–196, 333/150; 310/313 R, 313 B, 313 C, 313 D, 313 A

[56] References Cited

U.S. PATENT DOCUMENTS

| | | | |
|---|---|---|---|
| 3,446,975 | 5/1969 | Adler et al. | 333/193 |
| 3,878,407 | 4/1975 | Hartemann et al. | 310/313 R |
| 4,065,734 | 12/1977 | Takeno et al. | 333/193 |
| 4,166,258 | 8/1979 | Tseng | 333/196 |
| 4,423,395 | 12/1983 | Shirahama | 333/193 |
| 4,449,107 | 5/1984 | Asai et al. | 333/150 |
| 4,491,811 | 1/1985 | Niitsuma et al. | 333/194 |
| 5,162,822 | 11/1992 | Wakamori | 333/193 |
| 5,202,652 | 4/1993 | Tabuchi et al. | 333/193 |
| 5,281,882 | 1/1994 | Sugai | 310/313 A |
| 5,506,552 | 4/1996 | Seki et al. | 333/195 |
| 5,521,453 | 5/1996 | Yatsuda | 333/193 |

FOREIGN PATENT DOCUMENTS

| | | |
|---|---|---|
| 0019044 | 2/1977 | Japan. |
| 0222511 | 10/1991 | Japan. |
| 0222512 | 10/1991 | Japan. |
| 5022074 | 1/1993 | Japan. |

OTHER PUBLICATIONS

Taiwan Office Action with English Translation and [publication] "Oscillator Design...", Prentice Hall, 1990, pp. 181 and 232; Rhea, R.W.

*Primary Examiner*—Benny T. Lee
*Assistant Examiner*—Darius Gambino
*Attorney, Agent, or Firm*—Armstrong, Westerman, Hattori, McLeland & Naughton

[57] ABSTRACT

A surface acoustic wave (SAW) resonance device includes a SAW resonator formed on a piezoelectric substrate and including driving electrodes formed in a comb-like shape and reflectors arranged in both sides of the driving electrodes, and at least one capacitor formed on the piezoelectric substrate and electrically connected to the driving electrodes. A capacitance of the capacitor is set to be a specific value in accordance with a manner of connection of the capacitor to the SAW resonator. By the constitution, it is possible to simply and precisely carry out a frequency adjustment of the SAW resonance device. It is also possible to suppress occurrence of undesirable ripples or spurious signals to thereby obtain electric characteristics equivalent to those obtained in the case where the number of pairs of driving electrodes is increased.

6 Claims, 6 Drawing Sheets

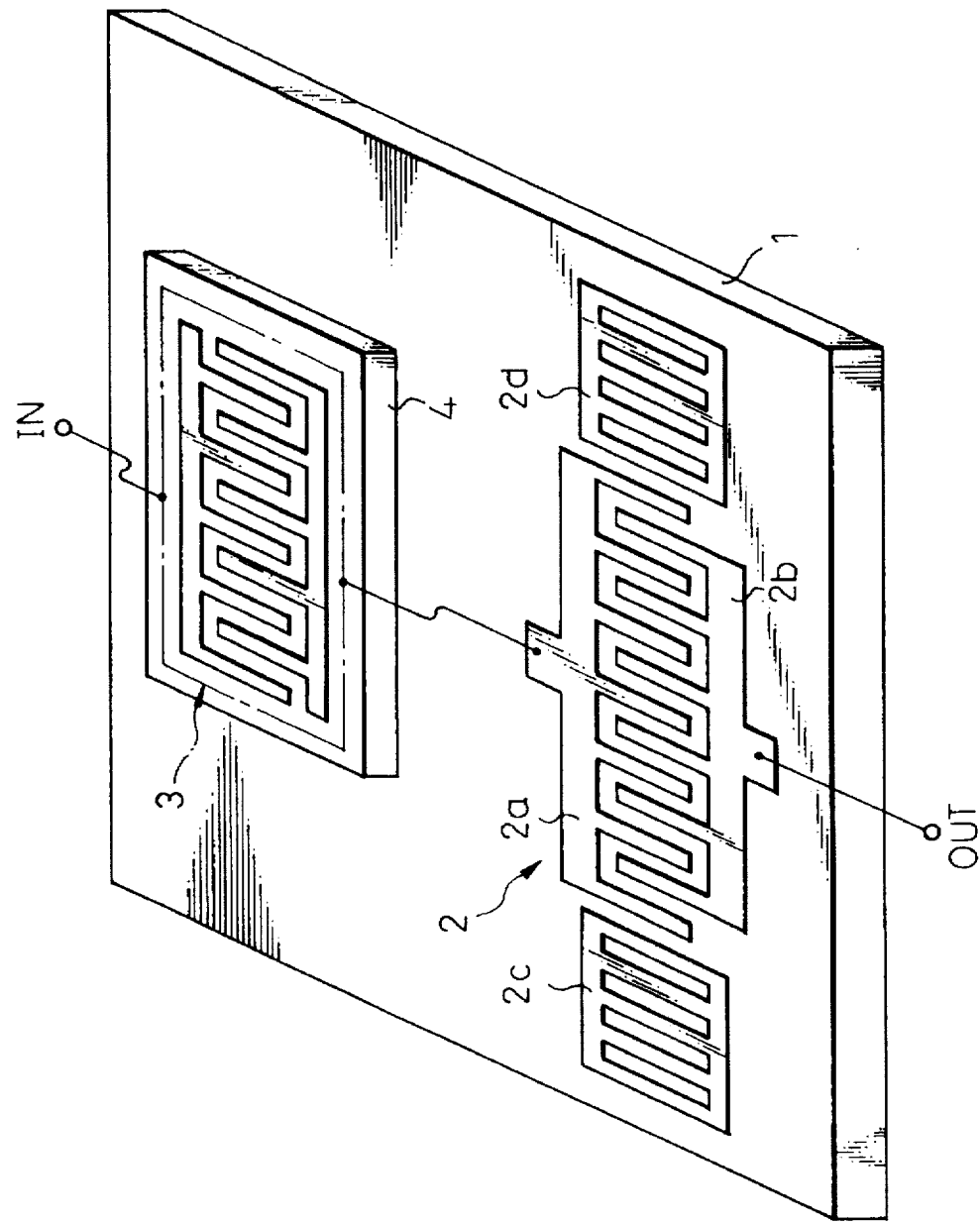

SURFACE ACOUSTIC WAVE RESONANCE DEVICE ADAPTED TO SIMPLE AND PRECISE ADJUSTMENT OF RESONANT FREQUENCY

This application is a continuation of application Ser. No. 08/406,520 filed Mar. 20, 1995, now abandoned.

BACKGROUND OF THE INVENTION

1. Field of the Invention

The present invention relates to a resonance device using elements utilizing a surface acoustic wave, hereinafter referred to as a SAW resonance device.

In recent years, portable telephones, cordless telephones, car telephones, or the like, have been developed to have a small size and a light weight, and thus have come into wide use. Also, with a recent development of minute processing technology, a device using a SAW element is used as a filtering device having a small size and a high performance, in a radio frequency (RF) or intermediate frequency (IF) signal processing block in a telephone set, a mobile radio apparatus, or a communication apparatus. Especially a SAW resonance device is widely used in a narrow-band filter, a resonator-type filter, or an oscillator. The frequency of an electric wave used as an information transfer medium has become high with a recent increase in the quantity of information. Accordingly, no little expectation is placed on a device using such a SAW element.

2. Description of the Related Art

FIG. 1 schematically illustrates the constitution of a prior art SAW resonance device.

In the illustration, reference 10 denotes a substrate composed of piezoelectric material, and reference 20 denotes a SAW resonator formed on the piezoelectric substrate 10. The piezoelectric substrate 10 is composed of single crystal such as lithium niobate ($LiNbO_3$) or lithium tantalate ($LiTaO_3$), or is composed of ceramic such as lead zirco-titanate. Also, the SAW resonator 20 is constituted by a pair of comb-like electrodes or inter-digital transducers (IDTs) 21 and 22 functioning as driving electrodes, respectively, and a pair of reflectors 23 and 24 arranged in both sides of the IDTs 21 and 22. Each of the IDTs 21, 22 and the reflectors 23, 24 is formed by depositing metal, e.g., aluminium (Al), on the piezoelectric substrate 10 by sputtering, and then carrying out a predetermined patterning with respect to the deposited metal film. In this case, the patterning is carried out such that finger portions $F_1$ of the input (IN) side IDT 21 and finger portions $F_2$ of the output (OUT) side IDT 22 are put between one another.

Note, reference $\lambda_{IDT}$ indicates a distance (pitch) between two adjacent fingers $F_1$, $F_2$ in each comb-like electrode (IDT) 21, 22, and reference $\lambda_{REF}$ indicates a distance (pitch) between two adjacent electrodes in each reflector 23, 24.

In the SAW resonance device thus constituted, a surface acoustic wave (SAW) generated by the driving electrodes (IDTs) 21, 22 is reflected on the reflectors 23, 24 to thereby generate a standing wave, and thus a vibration with a high "Q" is excited. In this case, the excited vibration (frequency) is determined depending on each magnitude of the above pitches $\lambda_{IDT}$ and $\lambda_{REF}$.

In the SAW resonance device, when a certain voltage is applied to each electrode (IDT) 21, 22, the voltage is applied in the positive and negative directions, respectively, at intervals of $\lambda_{IDT}/2$, and thus expansion and contraction of each IDT is caused by the piezoelectric conversion. In view of this, a pair of fingers of each IDT corresponding to a pair of positive and negative impulses are hereinafter referred to as "a pair of driving electrodes".

In a prior art, where a frequency adjustment of the SAW resonance device is carried out, this has been coped with by forming a certain film such as a $SiO_2$ film on the SAW resonator 20 and mechanically controlling its resonant vibration per se.

According to this prior art, it is necessary to delicately control the thickness of the film to be formed. However, such a delicate control of the thickness of the film is practically impossible from a viewpoint of the production process. Accordingly, this prior art poses a problem in that the frequency adjustment of the SAW resonance device tends to be fluid and thus it is impossible to precisely carry out the frequency adjustment.

Also, in another prior art, the frequency adjustment of the SAW resonance device has been carried out by connecting an external impedance element such as a capacitor to the SAW resonator 20 and adjusting its impedance value.

However, this prior art poses a problem in that, depending on an impedance deviation of the external impedance element, it is impossible to simply carry out a precise frequency adjustment with respect to the SAW resonance device.

On the other hand, in a resonator-type band-pass filter in which a plurality of SAW resonance devices are connected in series and in parallel with each other in the form of a ladder, it is necessary to increase the quantity of attenuation of the signal in the outside of the band for the purpose of improving the frequency-pass characteristics. This has been coped with, according to a known prior art, by increasing the number of pairs of driving electrodes in SAW resonance devices connected in parallel with each other.

This prior art has the advantage of improving the frequency-pass characteristics, but poses a problem in that undesirable ripples or spurious signals occur at a certain frequency in the vicinity of the band. This is not desirable from a viewpoint of the electric characteristics of the band-pass filter.

SUMMARY OF THE INVENTION

An object of the present invention is to provide a surface acoustic wave (SAW) resonance device in which it is possible to simply and precisely carry out a frequency adjustment thereof, and also to suppress occurrence of undesirable ripples or spurious signals to thereby obtain electric characteristics equivalent to those obtained in the case where the number of pairs of driving electrodes is increased.

According to the present invention, there is provided a surface acoustic wave (SAW) resonance device including: a SAW resonator formed on a piezoelectric substrate and including driving electrodes formed in a comb-like shape and reflectors arranged in both sides of the driving electrodes; and at least one capacitor formed on the piezoelectric substrate and electrically connected to the driving electrodes, a capacitance of the capacitor being set to be a specific value in accordance with a manner of connection of the capacitor to the SAW resonator.

BRIEF DESCRIPTION OF THE DRAWINGS

Other objects and features of the present invention will be described hereinafter in detail by way of preferred embodiments with reference to the accompanying drawings, in which:

FIG. 2 is a perspective view showing the fundamental constitution of the SAW resonance device according to the present invention;

DESCRIPTION OF THE PREFERRED EMBODIMENTS

Figure 1:
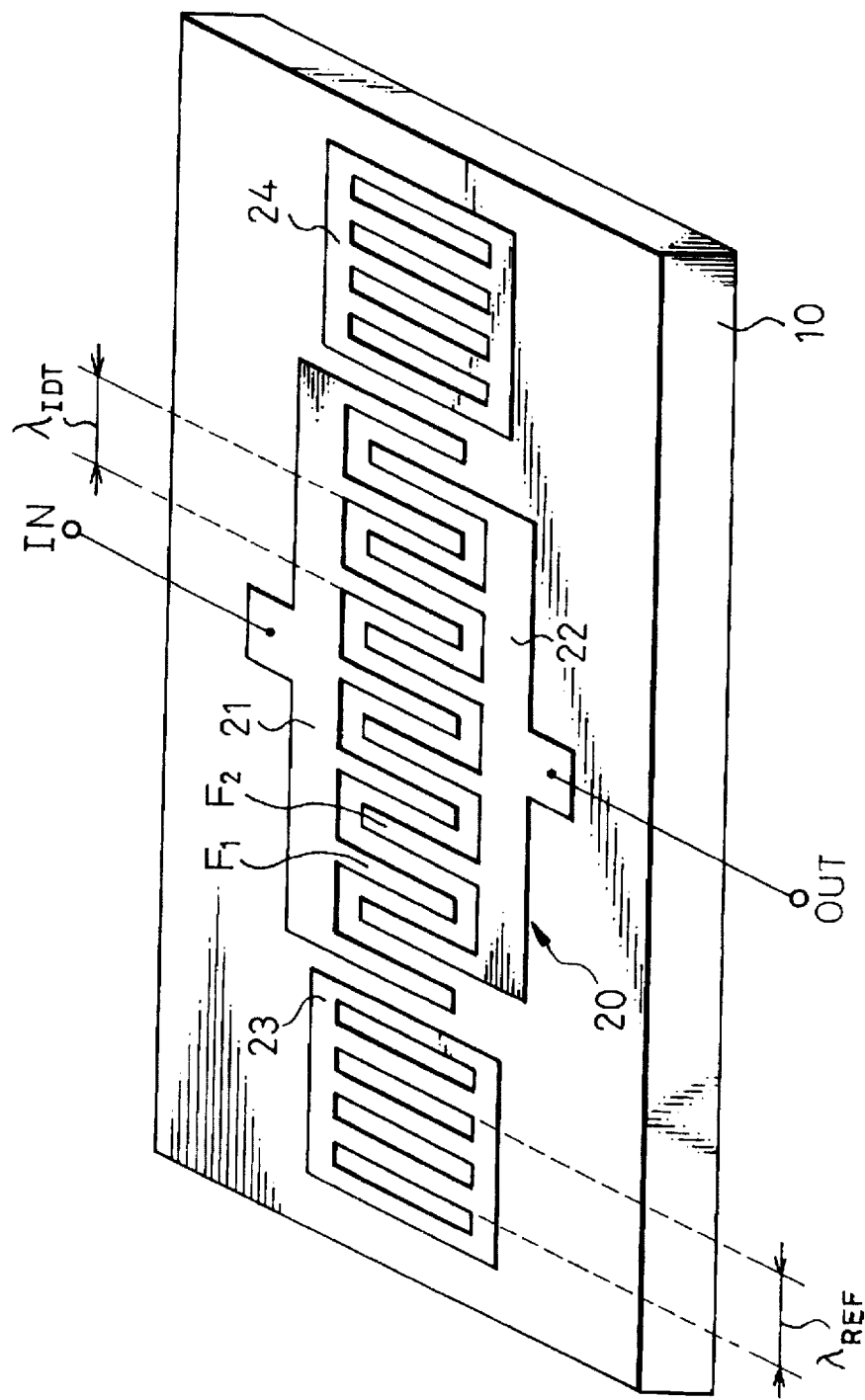
FIG. 1 is a perspective view schematically showing the constitution of a prior art SAW resonance device.

FIG. 2 illustrates the fundamental constitution of the surface acoustic wave (SAW) resonance device according to the present invention.

As shown in FIG. 2, the present SAW resonance device includes a SAW resonator 2 formed on a piezoelectric substrate 1. The SAW resonator 2 includes driving electrodes 2a, 2b each formed in a comb-like shape and reflectors 2c, 2d arranged in both sides of the driving electrodes 2a, 2b. The SAW resonance device further includes at least one capacitor 3 formed on the piezoelectric substrate 1 and electrically connected to the driving electrodes. A capacitance of the capacitor 3 is set to be a specific value in accordance with a manner of connection (series connection, parallel connection, and the like) of the capacitor 3 to the SAW resonator 2.

Also, in preferred embodiments of the present invention as described later, the capacitor 3 has electrodes formed in a comb-like shape in the same manner as in the driving electrodes 2a, 2b. Furthermore, the capacitor 3 is formed via an insulation film 4 formed on the piezoelectric substrate 1.

Hereinafter, the mode of operation of the SAW resonance device shown in FIG. 2 will be explained with reference to FIGS. 3a to 3c.

Figure 3A:
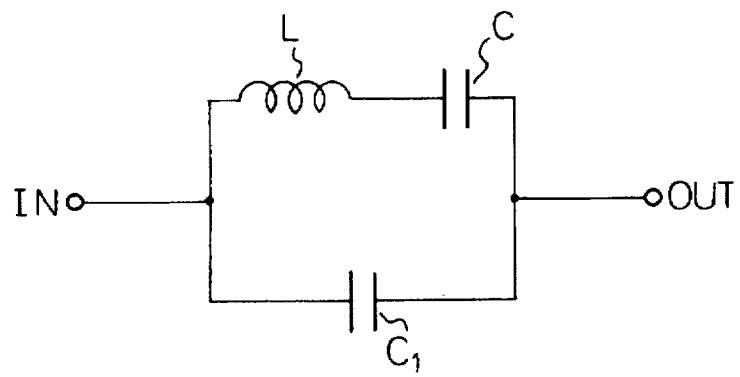
FIGS. 3a to 3c are equivalent circuit diagrams for explaining the mode of operation of the SAW resonance device shown in FIG. 2.
Figure 3B:
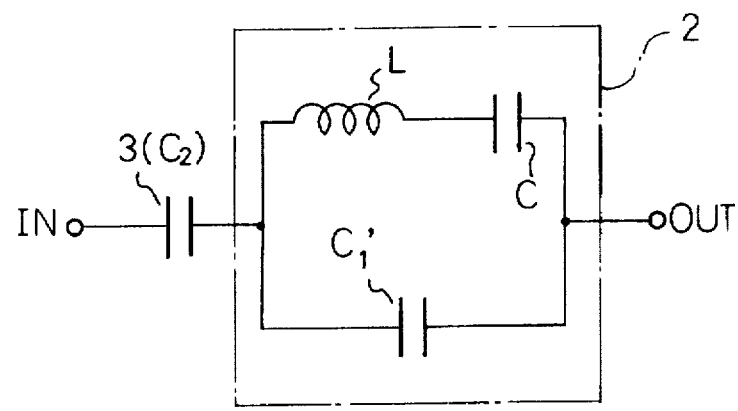
Figure 3C:
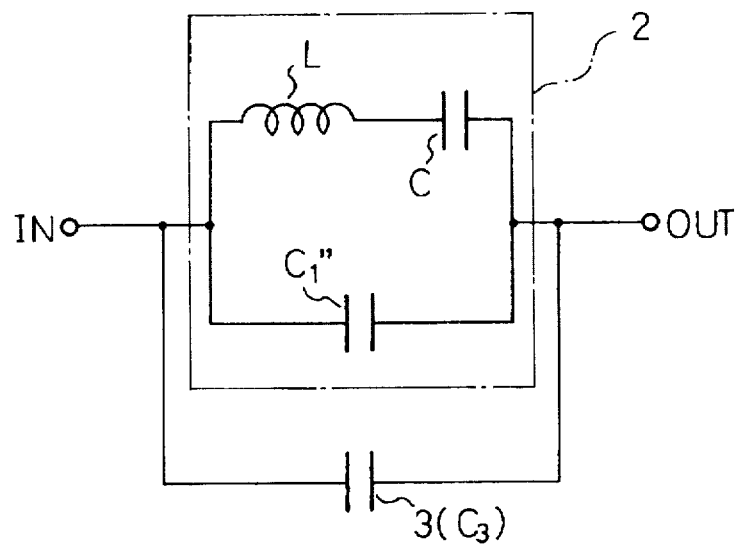

FIG. 3a shows an equivalent circuit of a conventional SAW resonance device, and FIGS. 3b and 3c show equivalent circuits of the SAW resonance device according to the present invention, respectively. FIG. 3b shows the constitution in the case where the capacitor 3 is connected in series to the SAW resonator 2, and FIG. 3c shows the constitution in the case where the capacitor 3 is connected in parallel to the SAW resonator 2.

In FIGS. 3a to 3c, reference L denotes a series inductance of the SAW resonator; reference C a series capacitance of the SAW resonator; and references $C_1$, $C_1'$ and $C_1''$ each an electrostatic capacitance of the corresponding SAW resonator, which is in proportion to the number of pairs of driving electrodes constituting the corresponding SAW resonator. Also, references $C_2$ and $C_3$ each denote a capacitance of the capacitor 3 set in the specific manner of connection.

Assuming that resonant and antiresonant frequencies of the circuit of FIG. 3a are $\omega r_1$ and $\omega a_1$; resonant and antiresonant frequencies of the circuit of FIG. 3b are $\omega r_2$ and $\omega a_2$; and resonant and antiresonant frequencies of the circuit of FIG. 3c are $\omega r_3$ and $\omega a_3$, respective frequencies are expressed by the following equations (1) to (6).

$$\omega r_1 = 1/(LC)^{1/2} \tag{1}$$

$$\omega a_1 = \{(1/L) \cdot (1/C + 1/C_1)\}^{1/2} \tag{2}$$

$$\omega r_2 = [(1/L) \cdot \{1/C + 1/(C_1' + C_2)\}]^{1/2} \tag{3}$$

$$\omega a_2 = \{(1/L) \cdot (1/C + 1/C_1')\}^{1/2} \tag{4}$$

$$\omega r_3 = 1/(LC)^{1/2} \tag{5}$$

$$\omega a_3 = [(1/L) \cdot \{1/C + 1/(C_1'' + C_3)\}]^{1/2} \tag{6}$$

As is obvious from the equation (3), where the capacitor 3 is connected in series to the SAW resonator 2 (see FIG. 3b), it is possible to change the resonant frequency $\omega r_2$ in accordance with the capacitance $C_2$ of the capacitor 3.

Also, as is obvious from the equation (6), where the capacitor 3 is connected in parallel to the SAW resonator 2 (see FIG. 3c), it is possible to change the antiresonant frequency $\omega a_3$ in accordance with the capacitance $C_3$ of the capacitor 3.

On the other hand, in the equation (6), when the capacitance $C_3$ of the capacitor 3 is determined such that the relation of $C_1'' + C_3 = C_1$ is satisfied, the circuit of FIG. 3c becomes equivalent to that of FIG. 3a. Accordingly, the relations of $\omega r_3 = \omega r_1$ and $\omega a_3 = \omega a_1$ are obtained. Namely, this means that, without changing the resonant characteristics, it is possible to decrease the electrostatic capacitance $C_1''$ of the SAW resonator shown in FIG. 3c, compared with the electrostatic capacitance $C_1$ of the SAW resonator shown in FIG. 3a.

Therefore, in the case where the capacitor 3 is connected in parallel to the SAW resonator 2 as shown in FIG. 3c, when the capacitance $C_3$ of the capacitor 3 is set to be the above specific value, it is possible to decrease the number of pairs of driving electrodes constituting the SAW resonator 2 without giving any influence to the resonant characteristics.

Thus, according to the SAW resonance device of the present invention, the capacitor 3 is formed together with the SAW resonator 2 on the piezoelectric substrate 1 and the capacitance of the capacitor 3 is set to be a specific value in accordance with the manner of connection of the capacitor 3 to the SAW resonator 2. As a result, it is possible to precisely carry out a frequency adjustment of the SAW resonance device. Also, it is possible to obtain electric characteristics equivalent to those obtained in the case where the number of pairs of driving electrodes is increased. It is simultaneously possible to suppress occurrence of undesirable ripples or spurious signals.

Also, as shown in FIG. 2, by forming the capacitor 3 so as to have a comb-like shape in the same manner as in the driving electrodes 2a, 2b, it is possible to reduce the size with respect to the same capacitance, compared with the case of a conventional parallel-plate type capacitor. This meets the needs of small size and light weight.

Furthermore, by forming the capacitor 3 via the insulation film 4 on the piezoelectric substrate 1, it is possible to prevent a surface acoustic wave (SAW) from being excited on the piezoelectric substrate 1 by an electric field applied to the capacitor 3. As a result, the capacitor 3 can function only as a pure capacitance component.

Next, the preferred embodiments of the present invention will be explained in detail with reference to FIGS. 4 to 6.

Figure 4:
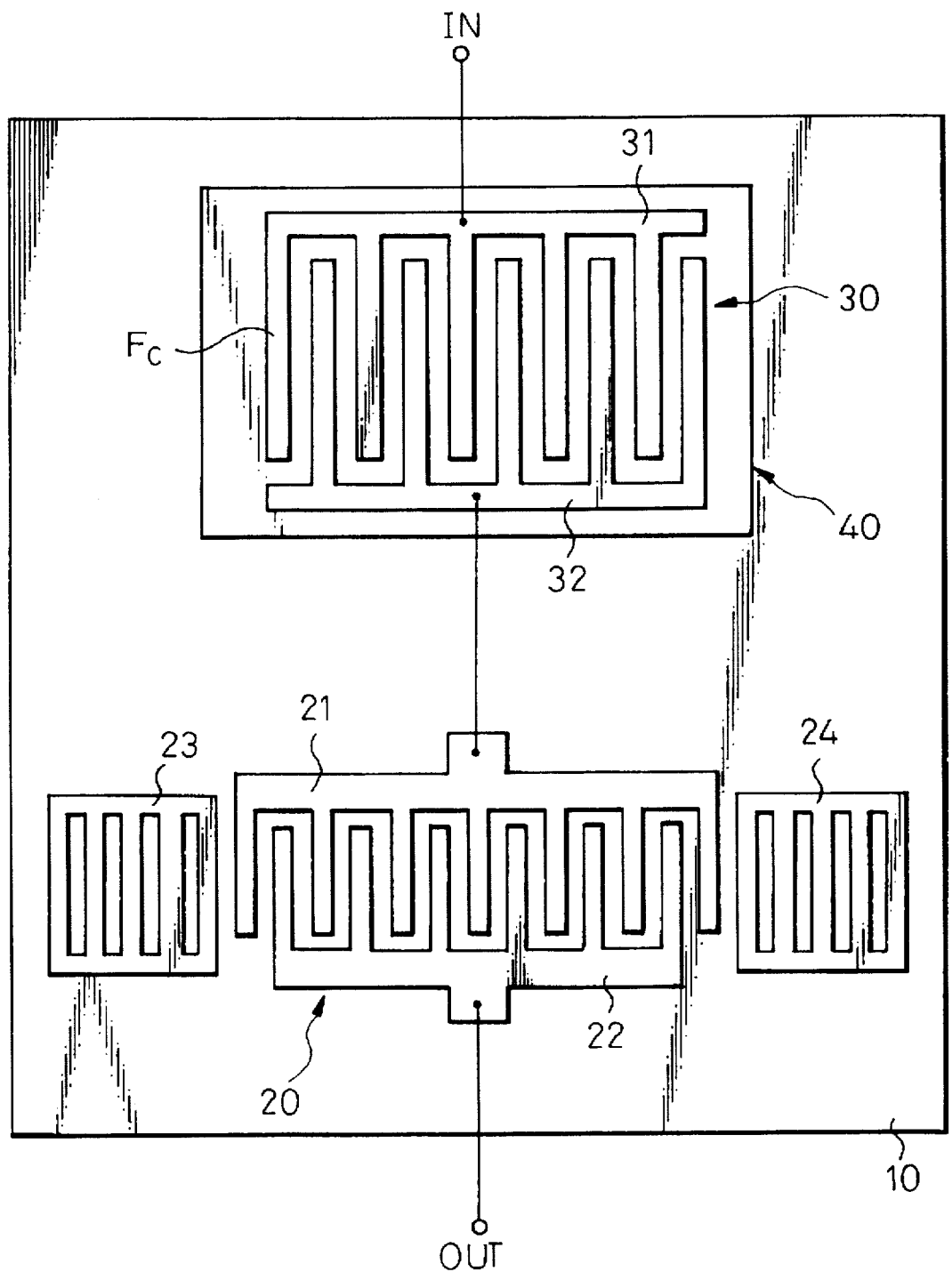
FIG. 4 is a plan view schematically showing the constitution of the SAW resonance device according to a first embodiment of the present invention.

FIG. 4 schematically shows the constitution of the SAW resonance device according to a first embodiment of the present invention.

In FIG. 4, the same references 10, 20, 21, 22, 23 and 24 as those shown in FIG. 1 denote like constituent elements, and thus the explanation thereof is omitted.

The present embodiment is characterized in that: firstly, a capacitor 30 is formed together with the SAW resonator 20 on the piezoelectric substrate 10; secondly, the capacitor 30 is formed so as to have a comb-like shape in the same manner as in the driving electrodes 21, 22; thirdly, the capacitor 30 is formed via an insulation film 40 (e.g., SiO$_2$ film) on the piezoelectric substrate 10; and fourthly, the capacitor 30 is connected in series to the driving electrode (input-side IDT 21) of the SAW resonator 20.

The capacitor 30 is constituted by two comb-like electrodes 31 and 32. Each electrode 31, 32 is formed by depositing aluminium (Al) on the insulation film 40 by sputtering, and then carrying out a predetermined patterning with respect to the deposited aluminium film. In this case, the patterning is carried out such that respective finger portions Fc of each electrode 31, 32 are put between one another.

The SAW resonance device according to the present embodiment corresponds to the equivalent circuit shown in FIG. 3b. Accordingly, the capacitor 30 in the present embodiment is used in the adjustment of a resonant frequency of the SAW resonance device. Namely, by setting the capacitance of the capacitor 30 to be a specific value, it is possible to precisely determine the resonant frequency of the device.

The capacitance of the capacitor 30 can be set, for example, by forming the capacitor 30 so as to have a greater capacitance in advance, and then decreasing the number of fingers Fc at a later stage if necessary. Concretely, a method of cutting off some fingers Fc or a portion thereof by means of a laser, a method of chemically melting some fingers Fc or a portion thereof, or the like, can be used.

Also, since the capacitor 30 is formed so as to have a comb-like shape, it is possible to reduce the size of the capacitor 30 with respect to the same capacitance, compared with the case of a conventional parallel-plate type capacitor. Thus, it is possible to meet the needs of small size and light weight.

Furthermore, since the insulation film 40 is formed between the capacitor 30 and the piezoelectric substrate 10, it is possible to prevent a surface acoustic wave (SAW) from being excited on the piezoelectric substrate 10 by an electric field applied to the capacitor 30. Accordingly, the capacitor 30 can function as a pure capacitance component for the SAW resonator 20.

To this end, in the present embodiment, the insulation film 40 is selected to have a thickness at least twice the pitch between two adjacent fingers Fc in the capacitor 30.

Figure 5:
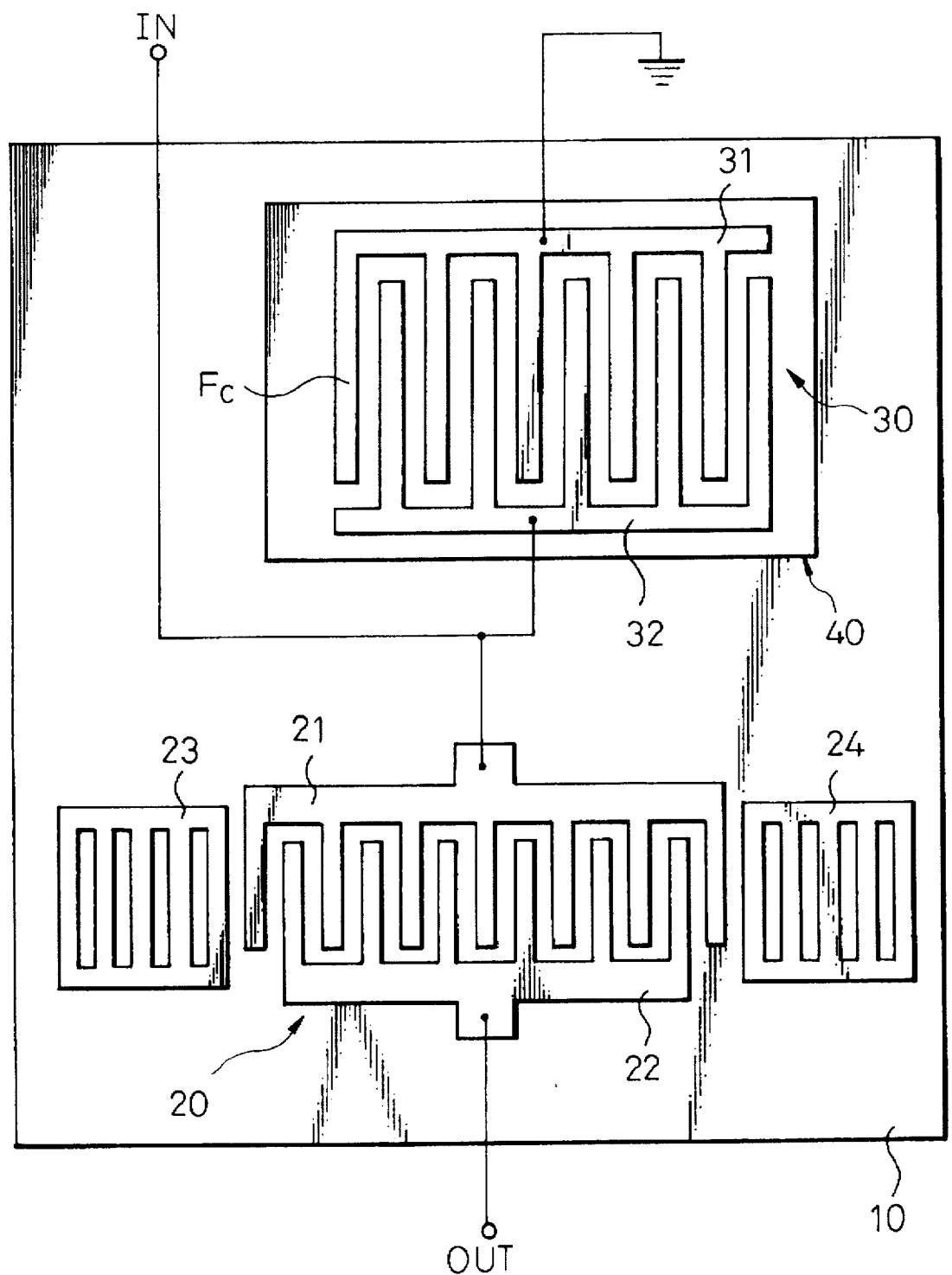
FIG. 5 is a plan view schematically showing the constitution of the SAW resonance device according to a second embodiment of the present invention.

FIG. 5 schematically shows the constitution of the SAW resonance device according to a second embodiment of the present invention.

The present embodiment is characterized in that the capacitor 30 is connected in parallel to the driving electrode (input-side IDT 21) of the SAW resonator 20. Other constitution is the same as that in the first embodiment (see FIG. 4), and thus the explanation thereof is omitted.

The SAW resonance device according to the present embodiment corresponds to the equivalent circuit shown in FIG. 3c. Accordingly, the capacitor 30 in the present embodiment is used in the adjustment of an antiresonant frequency of the SAW resonance device, and also contributes to decreasing the number of pairs of the driving electrodes 21, 22 in the SAW resonator 20.

Namely, by setting the capacitance of the capacitor 30 to be a specific value, it is possible to precisely determine the antiresonant frequency of the SAW resonance device, and also to decrease the number of pairs of driving electrodes of the SAW resonator 20 without giving any influence to the resonant characteristics. In other words, it is possible to obtain electric characteristics equivalent to those obtained in the case where the number of pairs of driving electrodes is increased. For example, where the present device is applied to a resonator-type bandpass filter, it is possible to improve the frequency-pass characteristics. Also, it is simultaneously possible to suppress occurrence of undesirable ripples or spurious signals.

The manner of setting the capacitance of the capacitor 30, the peculiar effect caused by presence of the insulation film 40, and selection of the thickness of the film, are the same as those in the case of the embodiment shown in FIG. 4, and thus the explanation thereof is omitted.

Figure 6:
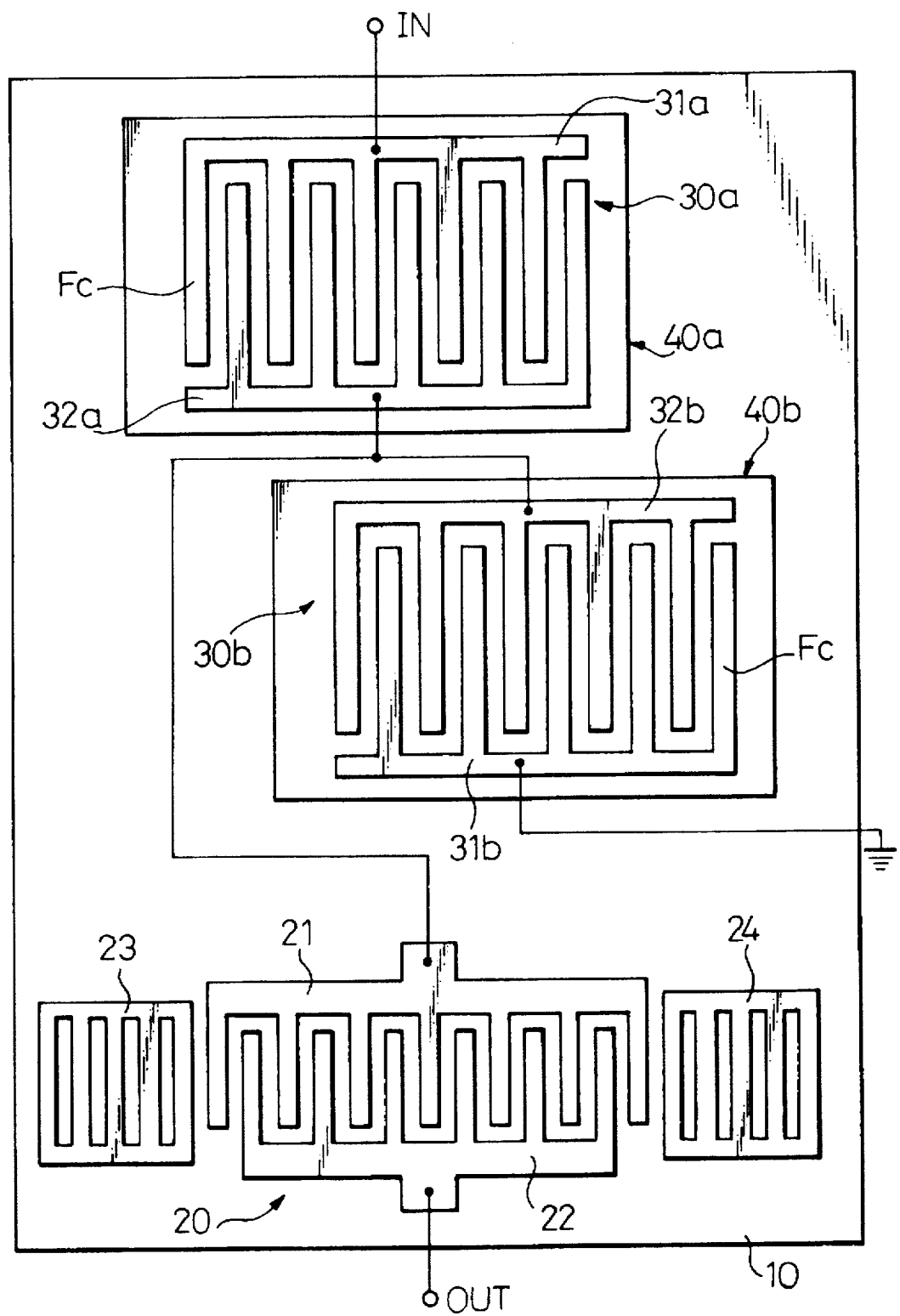
FIG. 6 is a plan view schematically showing the constitution of the SAW resonance device according to a third embodiment of the present invention.

FIG. 6 schematically shows the constitution of the SAW resonance device according to a third embodiment of the present invention.

The present embodiment is characterized in that: firstly, two capacitors 30a and 30b are formed together with the SAW resonator 20 on the piezoelectric substrate 10; secondly, each capacitor 30a, 30b is formed so as to have a comb-like shape in the same manner as in the driving electrodes 21, 22; thirdly, the capacitors 30a and 30b are formed via insulation films 40a and 40b, respectively, on the piezoelectric substrate 10; and fourthly, one capacitor 30a is connected in series to the driving electrode (input-side IDT 21) of the SAW resonator 20, and another capacitor 30b is connected in parallel to the driving electrode (input-side IDT 21) of the SAW resonator 20.

The SAW resonance device according to the present embodiment corresponds to a combination of the respective embodiments shown in FIGS. 4 and 5. Accordingly, the mode of operation of each capacitor 30a, 30b and effects based thereon are the same as those of each capacitor 30 explained in conjunction with FIGS. 4 and 5, and thus the explanation thereof is omitted.

Although the present invention has been disclosed and described by way of three embodiments, it is apparent to those skilled in the art that other embodiments and modifications of the present invention are possible without departing from the essential features thereof.

For example, the shape of a capacitor to be formed together with a SAW resonator on an identical piezoelectric substrate (the shape of electrode patterns, the number of fingers, and the like) may be suitably changed, or the number of capacitors to be formed may be changed. Also, the manner of connection of the capacitor to the SAW resonator may be suitably changed.

What is claimed is:

1. A surface acoustic wave resonance device comprising:
   a surface acoustic wave resonator formed on a piezoelectric substrate including driving electrodes formed in a comb-like shape and reflectors arranged on both sides of the driving electrodes; and
   at least one capacitor formed on said piezoelectric substrate and electrically connected to said driving electrodes, a capacitance of the capacitor being set to be a specific value in accordance with a manner of connection of the capacitor to said surface acoustic wave detector;
   said at least one capacitor having electrodes formed as fingers in a comb-like shape; said at least one capacitor being formed via an insulation film formed on said piezoelectric substrate; and
   wherein said insulation film has a thickness at least twice a pitch between two adjacent fingers in the comb-like shape of an electrode of said at least one capacitor to thereby prevent a surface acoustic wave from being generated on the piezoelectric substrate due to an electric field applied to said at least one capacitor.

2. The surface acoustic wave resonance device according to claim 1, wherein a resonant frequency or antiresonant frequency of the resonance device is determined depending on the number of fingers in the comb-like electrodes constituting said at least one capacitor.

3. The surface acoustic wave resonance device according to claim 1, comprising one capacitor connected in series to said surface acoustic wave resonator, wherein a capacitance of the capacitor is set to be a specific value to determine a resonant frequency of the resonance device.

4. The surface acoustic wave resonance device according to claim 1, comprising one capacitor connected in parallel to said surface acoustic wave resonator, wherein a capacitance of the capacitor is set to be a specific value to determine an antiresonant frequency of the resonance device.

5. The surface acoustic wave resonance device according to claim 1, comprising a first capacitor connected in series to said surface acoustic wave resonator and a second capacitor connected in parallel to the surface acoustic wave resonator, wherein capacitances of the first and second capacitors are set to be specific values, respectively, to determine both a resonant frequency and an antiresonant frequency of the resonance device.

6. A surface acoustic wave resonance device comprising:

a surface acoustic wave resonator formed on a piezoelectric substrate including driving electrodes formed in a comb-like shape and reflectors arranged on both sides of the driving electrodes;

at least one capacitor formed on said piezoelectric substrate and electrically connected to said driving electrodes, a capacitance of the capacitor being set to be a specific value in accordance with a manner of connection of the capacitor to said surface acoustic wave resonator, said at least one capacitor having electrodes formed as fingers in a comb-like shape; and insulation means, interposed between said at least one capacitor and said piezoelectric substrate, for preventing a surface acoustic wave from being generated on the piezoelectric substrate due to an electric field being applied to said at least one capacitor.

\* \* \* \* \*